US010804224B2

United States Patent
Li

(10) Patent No.: US 10,804,224 B2
(45) Date of Patent: Oct. 13, 2020

(54) SEMICONDUCTOR STRUCTURES WITH IMPROVED BONDING AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Hai Ting Li, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 15/472,717

(22) Filed: Mar. 29, 2017

(65) Prior Publication Data
US 2017/0294392 A1    Oct. 12, 2017

(30) Foreign Application Priority Data
Apr. 8, 2016  (CN) .......................... 2016 1 0216862

(51) Int. Cl.
*H01L 21/768* (2006.01)
*H01L 23/60* (2006.01)
(Continued)

(52) U.S. Cl.
CPC ........ *H01L 23/60* (2013.01); *H01L 21/02002* (2013.01); *H01L 21/265* (2013.01);
(Continued)

(58) Field of Classification Search
CPC . H01L 21/3226; H01L 23/60; H01L 25/0657; H01L 29/772; H01L 21/76898;
(Continued)

(56) References Cited

U.S. PATENT DOCUMENTS

| 4,882,611 A * | 11/1989 | Blech ...................... H01L 45/10 257/50 |
| 2005/0280088 A1* | 12/2005 | Min .................... H01L 27/1203 257/347 |

(Continued)

FOREIGN PATENT DOCUMENTS

| CN | 103348473 A | 10/2013 |
| EP | 3154093 A1 | 4/2017 |
| WO | 2016016532 A1 | 2/2016 |

OTHER PUBLICATIONS

The European Patent Office (EPO) The Extended European Search Report for 17163844.8 dated Aug. 21, 2017 8 Pages.
(Continued)

*Primary Examiner* — Allen L Parker
*Assistant Examiner* — Gustavo G Ramallo
(74) *Attorney, Agent, or Firm* — Anova Law Group, PLLC

(57) ABSTRACT

A method for fabricating a semiconductor structure includes providing a wafer and a carrier wafer. The wafer includes a first bonding surface and a plurality of radio-frequency (RF) devices and the carrier wafer includes a second bonding surface. The method further includes performing a surface treatment process on the second bonding surface to convert a surface portion of the carrier wafer into a barrier layer to suppress movement of induced electrical charges in the carrier wafer, and then bonding the wafer with the carrier wafer through the first bonding surface and the second bonding surface, respectively.

18 Claims, 4 Drawing Sheets

(51) Int. Cl.
*H01L 21/762* (2006.01)
*H01L 21/02* (2006.01)
*H01L 21/265* (2006.01)
*H01L 21/8234* (2006.01)

(52) U.S. Cl.
CPC ...... *H01L 21/768* (2013.01); *H01L 21/76251* (2013.01); *H01L 21/823437* (2013.01)

(58) Field of Classification Search
CPC ............. H01L 21/76879; H01L 23/481; H01L 23/5384; H01L 27/1203
See application file for complete search history.

(56) References Cited

U.S. PATENT DOCUMENTS

| | | | | |
|---|---|---|---|---|
| 2007/0178649 | A1* | 8/2007 | Swift | B82Y 10/00 |
| | | | | 438/283 |
| 2008/0171419 | A1 | 7/2008 | Wen et al. | |
| 2010/0052046 | A1 | 3/2010 | Wang et al. | |
| 2011/0298021 | A1 | 12/2011 | Tada et al. | |
| 2013/0307144 | A1* | 11/2013 | Yu | H01L 24/81 |
| | | | | 257/737 |
| 2015/0270143 | A1* | 9/2015 | Kalnitsky | H01L 21/3226 |
| | | | | 257/617 |
| 2016/0028140 | A1* | 1/2016 | Kato | H05K 1/0242 |
| | | | | 333/238 |
| 2016/0103278 | A1* | 4/2016 | Cheng | H01S 5/026 |
| | | | | 385/14 |
| 2016/0189995 | A1* | 6/2016 | Gondcharton | H01L 27/0688 |
| | | | | 438/107 |

OTHER PUBLICATIONS

The European Patent Office (EPO), Office Action of 17163844.8, dated Jun. 24, 2020, 5 Pages.

* cited by examiner

SEMICONDUCTOR STRUCTURES WITH IMPROVED BONDING AND FABRICATION METHODS THEREOF

CROSS-REFERENCES TO RELATED APPLICATIONS

This application claims the priority of Chinese Patent Application No. CN201610216862.7, filed on Apr. 8, 2016, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With the development of semiconductor technology, integrated circuits (ICs) are developed in a direction of having high integration degree, high operation speed, and low energy consumption. Manufacturing technology for bulk silicon substrate and bulk silicon device (i.e. devices fabricated based on bulk silicon substrate) is approaching the physical limit, and further reducing the feature size of integrated circuits is facing crucial challenges. Currently, silicon on insulator (SOI) substrate and SOI device are believed to be one of the most promising options fibs replacing bulk silicon and bulk silicon device.

SOI substrate is a type of substrate used to fabricate integrated circuits. Compared to bulk silicon substrate which has been widely used, SOI substrate may demonstrate a number of advantages. For example, integrated circuits fabricated on SOI substrate may have a small parasitic capacitance, a high integration degree, suppressed short channel effect (SCE), and fast operation speed. In addition, integrated circuits fabricated on SOI substrates may also realize dielectric isolation between components of the integrated circuits, and thus may avoid the parasitic latch-up effect in bulk silicon integrated circuits.

Three-dimensional integrated circuit (3D IC) is an IC fabricated by stacking a plurality of chips with different functions into a 3D structure using advanced chip-stacking technology. Compared to IC with a two-dimensional (2D) structure, 3D IC adopts the chip-stacking technology that may reduce the signal transmission path of the 3D IC and also accelerate the operation speed of the 3D IC. In short, the chip-stacking technology of 3D IC demonstrates advantages that meet the requirements of semiconductor devices for higher performance, smaller size, lower energy consumption, and more functionalities.

Based on the methods used to connect the chips in 3D ICs, techniques to connect the stacked chips may be classified into metal wire bonding and flip-chip wafer bonding. Among the two connection techniques, the flip-chip wafer bonding technique may produce shorter electrical connection path as compared to the metal wire bonding technique, and thus the flip-chip wafer bonding technique may provide better thermal performance, better electrical performance, and smaller structure size. Therefore, the flip-chip wafer bonding technique is one of the key technologies at present to realize temporary or permanent bond between different chips.

However, the performance of existing semiconductor structures fabricated by the flip-chip wafer bonding technique still needs to be improved. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method for fabricating the semiconductor structure includes providing a wafer and a carrier wafer. The wafer includes a first bonding surface and a plurality of radio-frequency (RF) devices and the carrier wafer includes a second bonding surface. The method further includes performing a surface treatment process on the second bonding surface to convert a surface portion of the carrier wafer into a barrier layer to suppress movement of induced electrical charges in, the carrier wafer, and then bonding the wafer with the carrier wafer through the first bonding surface and the second bonding surface, respectively.

Another aspect of the present disclosure provides a semiconductor structure. The semiconductor structure includes a wafer and a carrier wafer. The wafer includes a first bonding surface and a plurality of RF devices and the carrier water includes a second bonding surface. The wafer and the carrier wafer are bonded together through the first bonding surface and the second bonding surface, respectively. In addition, the semiconductor structure also includes a barrier layer in the carrier wafer and at an interface between the wafer and the carrier wafer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

When a wafer is bonded to a carrier wafer, the electrical field generated from the radio-frequency (RF) devices in the wafer may easily cause induced electrical charges in the carrier wafer, and the induced electrical charges may be driven to move between the wafer and the carrier wafer, leading to an energy loss issue for RF signals.

Figure 9:
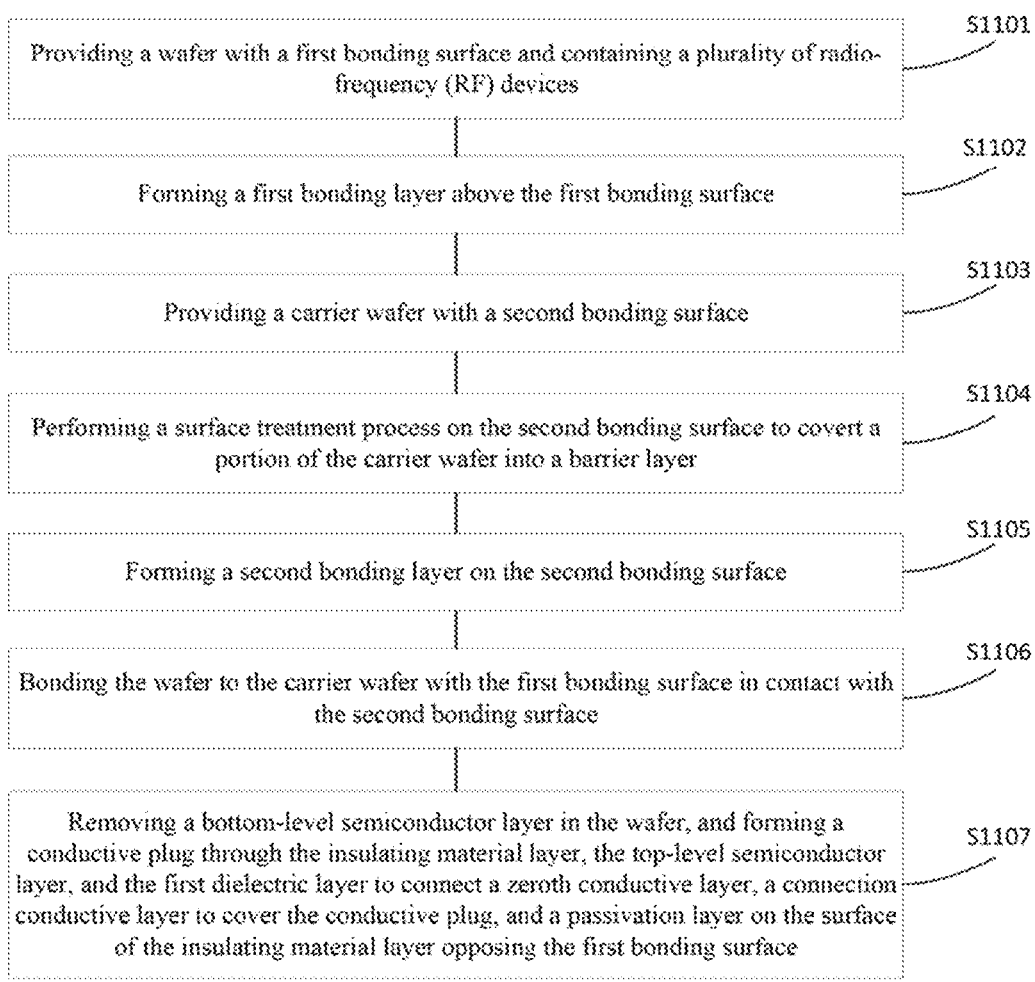
FIG. 9 illustrates a flowchart of an exemplary fabrication process for a semiconductor structure consistent with disclosed embodiments in the present disclosure.

The present disclosure provides a method for fabricating a semiconductor structure. FIG. 9 shows a flowchart of an exemplary fabrication process for a semiconductor structure consistent with disclosed embodiments in the present disclosure. FIGS. 1-7 show schematic cross-section views of semiconductor structures at certain stages of the exemplary fabrication process.

Figure 1:
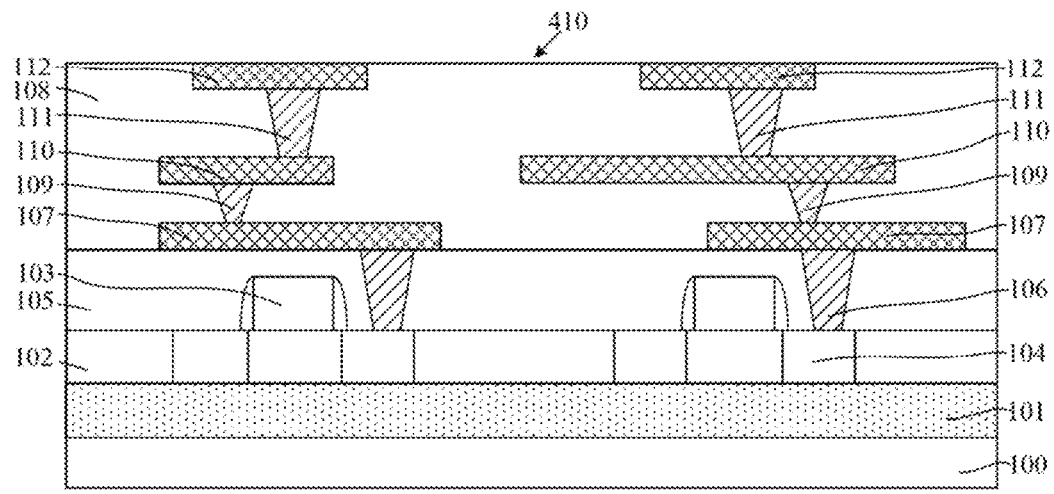
FIGS. 1-7 illustrate, schematic cross-section views of semiconductor structures at certain stages of an exemplary fabrication process consistent with disclosed embodiments in the present disclosure.

Referring to FIG. 9, at beginning of the fabrication process, a wafer with a first bonding surface and containing a plurality of RF devices is provided (S1101). FIG. 1 shows a schematic cross-section view of a corresponding semiconductor structure.

Referring to FIG. 1, a wafer (not labeled) is provided. A plurality of RF devices may be formed in the wafer. The wafer may have a first bonding surface 410. The first bonding surface 410 may be bonded to a carrier wafer in a subsequent process.

Specifically, the wafer may be provided after performing the following steps. First, a base structure (not shown) may be formed. The base structure may include a bottom-level semiconductor layer 100, an insulating material layer 101 formed on the bottom-level semiconductor layer 100, and a top-level semiconductor layer 102 formed on the surface of the insulating material layer 101. The top-level semiconductor layer 102 may further contain a plurality of transistor regions (not labeled). Then, a plurality of gate structures 103 may be formed on a portion of the surface of the top-level semiconductor layer 102 in the transistor regions. A doped region 104 may then be formed in the top-level semiconductor layer 102 in the transistor regions on both sides of each gate structure 103.

Further, a first dielectric layer 105 may be formed on the surface of the top-level semiconductor layer 102. The first dielectric layer 105 may cover the plurality of gate structures 101 and the plurality of doped regions 104. The top surface of the first dielectric layer 105 may be higher than the top surfaces of the gate structures 103. A zeroth conductive plug 106 may be formed on the surface of each doped region 104 through the first dielectric layer 105, and a zeroth conductive layer 107 may then be formed above the first dielectric layer 105 to electrically connect to the zeroth conductive plug 106. Moreover, a second dielectric layer 108 may be formed above the first dielectric layer 105 to cover the zeroth conductive layer 107. An interconnection structure (not labeled) may be formed in the second dielectric layer 108 to electrically connect to each zeroth conductive layer 107. The interconnection structure may include a top-level conductive layer 112 with the top surface exposed by the second dielectric layer 108. Specifically, the surface of the second dielectric layer exposing the top-level conductive layer 112 may be the first bonding surface 410.

The bottom-level semiconductor layer 100 may be made of silicon, germanium, SiGe, SiC, GaAs, InAs, etc. The insulating material layer 101 may be made of $SiO_x$, $SiN_x$, SiON, SiCN, SiCON, etc. The top-level semiconductor layer 102 may be made of silicon, germanium, SiGe, SiC, GaAs, InAs, etc. In one embodiment, the bottom-level semiconductor layer 101 is made of silicon, the insulating material layer 101 is made of $SiO_x$, and the top-level semiconductor layer 102 is made of silicon. In another embodiment, an SOI substrate may be used to include the bottom-level semiconductor layer 100, the insulating material layer 101, and the top-level semiconductor layer 102.

In one embodiment, a plurality of transistors may be formed in the transistor regions. Each gate structure 103 may include a gate dielectric layer and a gate electrode layer formed on the gate dielectric layer. The gate dielectric layer may be made of $SiO_x$ or a high-k dielectric material. The high-k dielectric material may include hafnium oxide, zirconium oxide, aluminum oxide, HfSiO, etc. The gate electrode layer may be made of one or more of Ti, Ta, Cu, Al, W, Ag, Au, etc. In addition, a work function layer may be formed between the gate dielectric layer and the gate electrode layer.

Each doped region 104 may be used to form a source region or a drain region of a transistor. Specifically, when a transistor region is a PMOS region, the doped ions in the corresponding doped region 104 may be P-type ions, such as B, Ga, and In; when a transistor region is an NMOS region, the doped ions in the corresponding doped region 104 may be N-type ions, such as P, As, and Sb.

In one embodiment, the semiconductor structure may also include a sidewall spacer (not labeled) on each side surface of the gate structure 103. The sidewall spacer may be made of $SiO_x$, $SiN_x$, SiC, SiCN, SiCON, SiON, BN, BCN, etc. The sidewall spacer may have a single-layer structure or a multiple-layer structure. In one embodiment, the sidewall spacer has a single-layer structure and is made of $SiN_x$.

The first dielectric layer 105 may cover the top and the sidewall surfaces of the gate structures 103. The first dielectric layer 105 may have a single-layer structure or a multiple-layer structure, and may be made of $SiO_x$, $SiN_x$, SiON, etc. In one embodiment, the first dielectric layer 105 is made of $SiO_x$.

The zeroth conductive plug 106 may be used to electrically connect the corresponding zeroth conductive layer 107 to the interconnection structure (not labeled) in the second dielectric layer 108. In one embodiment, the zeroth conductive plug 106 may be made of a conductive material including one or more of Cu, Al, W, Ti, etc.

In one embodiment, the zeroth conductive layer 107 may be formed on the surface of the first dielectric layer 105 and also on the surfaces of the zeroth conductive plugs 106. Specifically, based on the requirement of internal circuit connections of the semiconductor structure, a plurality of discrete zeroth conductive layers 107 may be formed on the surface of the first dielectric layer 105.

The plurality of zeroth conductive layers 107 may be made of a conductive material including one or more of Cu, Al, W, Ti, etc. In one embodiment, the plurality of zeroth conductive layer 107 may be made of Al.

In one embodiment, along a direction perpendicular to the surface of the top-level semiconductor layer 102 and from the top-level semiconductor layer 102 to the second dielectric layer 108, the interconnection structure may include N (N≥2) layers of conductive layers, and may also include a Nth conductive plug (not shown) between the (N−1)th conductive layer and the Nth conductive layer. The Nth conductive plug may electrically connect the (N−1)th conductive layer to the Nth conductive layer. In one embodiment, the Nth conductive layer may be the top-level conductive layer 112 with the top surface exposed by the second dielectric layer 108 as shown in FIG. 1.

The second dielectric layer 108 may include at least one sub dielectric layer. When the second dielectric layer 108 is formed by two or more sub dielectric layers, the sub dielectric layers may be stacked together to form the second dielectric layer 108. The sub dielectric layer may be made of $SiO_x$, $SiN_x$, SiON, SiCN, SiCON, etc. For example, the second dielectric layer 108 may have a single-layer structure with one sub dielectric layer, however, the second dielectric layer may also include 2, 5, 7, or 10, or any suitable number of sub dielectric layers.

For illustration purpose, in one embodiment, the interconnection structure is described to include two discrete sub conductive layers. Along a direction from the top-level semiconductor layer 102 to the second dielectric layer 108, the interconnection structure includes discretely arranged conductive layers including, for example, a first conductive layer 110 and a second conductive layer 112 as well as a second conductive plug 111 formed between the first conductive layer 110 and the second conductive layer 112. The second conductive plug 111 electrically connects the first conductive layer 110 and the second conductive layer 112. In addition, the interconnection structure also includes a first conductive plug 109 formed between the first conductive layer 110 and the zeroth conductive layer 107. The first conductive plug 109 electrically connects the zeroth conductive layer 107 to the first conductive layer 110. The second conductive layer 112 may be the top-level conductive layer 112.

In other embodiments, the interconnection structure may only include a single conductive layer. The interconnection structure may thus include the top-level conductive layer and a first conductive plug electrically connecting the top-level conductive layer to the zeroth conductive layer.

In one embodiment, N may be any natural number greater than or equal to 2. For example, the interconnection structure may include 5 conductive layers, 7 conductive layers, or 10 conductive layers. Further, the number of the conductive plugs may be determined according to the number of the conductive layers.

The interconnection structure may be made of a conductive material including one or more of Cu, Al, W, Ti, etc. in one embodiment, the interconnection structure is made of Al.

Figure 2:
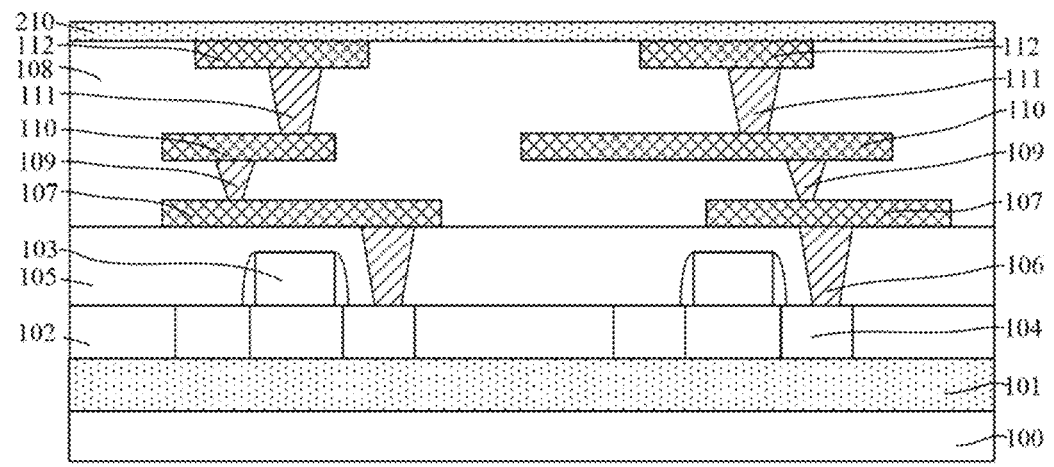

Returning to FIG. 9, the fabrication process may include forming a first bonding layer above the first bonding surface (S1102). FIG. 2 shows a schematic cross-section view of a corresponding semiconductor structure.

Referring to FIG. 2, a first bonding layer 210 may be formed on the first bonding surface 410 (referring to FIG. 1). In a subsequent process, the wafer may be bonded to a carrier wafer through the first bonding layer 210. The presence of the first bonding layer 210 may improve the bonding strength between the wafer and the carrier wafer.

The first bonding layer 210 may be made of $SiO_x$ or $SiN_x$. In one embodiment, the first bonding layer 210 is made of $SiO_x$.

Figure 3:
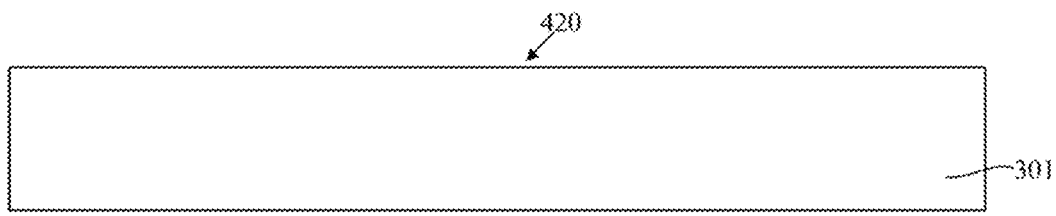

Further, returning to FIG. 9, a carrier wafer with a second bonding surface may be provided (S1103). FIG. 3 shows a schematic cross-section view of a corresponding carrier wafer.

Referring to FIG. 3, a carrier wafer 301 is provided. The carrier wafer may have a second bonding surface 420. The carrier wafer 301 may be made of silicon, germanium, SiGe, SiC, GaAs, InAs, etc. In one embodiment, the carrier wafer 301 is made of silicon.

The description of the carrier wafer 301 may be referred to the corresponding content for the wafer described above.

Figure 4:
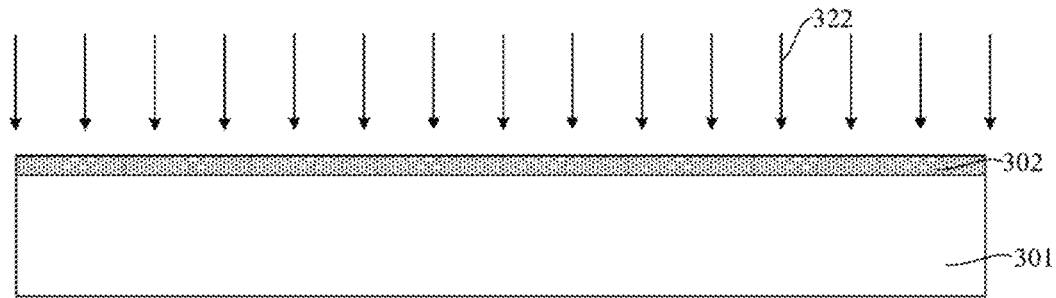

Further, returning to FIG. 9, a surface treatment process may be performed on the second bonding surface to convert a portion of the carrier wafer into a barrier layer (S1104). FIG. 4 shows a schematic cross-section view of a corresponding semiconductor structure.

Referring to FIG. 4, the second bonding surface 420 (referring to FIG. 3) may be treated by a surface treatment process. After the surface treatment process, a surface portion of the carrier wafer 301 may be convened into a barrier layer 302.

The barrier layer 302 may be used to suppress the movement of induced electrical charges in the carrier wafer 301 after the carrier wafer is bonded to the wafer described above in a subsequent process.

Specifically, the surface treatment process performed on the second bonding surface 420 may include performing an ion implantation process 322 on the second bonding surface 420.

The ions doped during the ion implantation process may be heavy ions. Specifically, the ions doped during the ion implantation process may be Ar ions, He ions, or Ne ions. In one embodiment, the ions doped during the ion implantation process may be Ar ions.

In one embodiment after the carrier wafer 301 is bonded to the wafer in a subsequent process, the RF devices in the wafer may generate an electric field. The electric field may easily cause induced electrical charges in the carrier wafer 301, and the induced electrical charges may be driven to move between the wafer and the carrier wafer 301, leading to an energy loss issue for RF signals. By doping the second bonding surface 420 of the carrier wafer 301 with heavy ions, the distribution of crystal lattices of the carrier wafer 301 may be better disrupted so that the material in a surface portion of the carrier wafer 301, i.e. single-crystalline silicon, may be converted into amorphous silicon. Therefore, the movement of induced electrical charges in the carrier wafer 301 may be suppressed. That is, in one embodiment, the barrier layer 302 may be made of amorphous silicon.

In the ion implantation process, the energy or the dosage of the doped ions may not be too large or too small. When the energy or the dosage of the doped ions is too small, the barrier layer 302 may not be able to formed in the carrier wafer 301, or the effect of disturbing the distribution of crystal lattices in the carrier wafer 301 may not be significant, and thus the suppression of the movement of induced electrical charges in the carrier wafer 301 may not reach desired results. When the energy or the dosage of the doped ions is too large, the distribution of the ions already doped in the carrier wafer 301 may be affected, and thus the electrical performance of the carrier wafer 301 may be affected. Therefore, in one embodiment, the energy of the ions doped during the ion implantation process may be in a range of 30 keV to 200 keV and the dosage of the ions doped during the ion implantation process may be in a range of 1E15 atom/cm$^2$ to 1E16 atom/cm$^2$.

Moreover, the thickness of the surface portion, of the carrier wafer 301 doped by the heavy ions may be determined by the process parameters used in the ion implantation process. That is, the thickness of the barrier layer 302 may be determined by the process parameters in the ion implantation process. By setting the process parameters in proper ranges, the thickness of the barrier layer 302 may be controlled in a reasonable range. As such, the movement of induced electrical charges in the carrier wafer 301 may be effectively suppressed, and in the meantime, undesired effect on the electrical performance of the carrier wafer 301 due to overly large thickness of the barrier layer 302 may be avoided.

Figure 5:
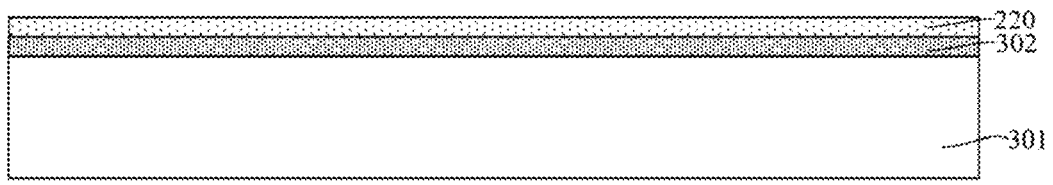

Returning to FIG. 9, further, a second bonding layer may be formed on the second bonding surface (S1105). FIG. 5 shows a schematic cross-section view of a corresponding semiconductor structure.

Referring to FIG. 5, after forming the barrier layer 302, a second bonding layer 220 may be formed on the second bonding surface 420 (referring to FIG. 3). In a subsequent process, the carrier wafer 301 may be bonded to the wafer described above through the second bonding layer 220. The presence of the second bonding layer 220 may improve the bonding strength between the carrier wafer 301 and the wafer.

The second bonding layer 220 may be made of $SiO_x$ or $SiN_x$. In order to improve the bonding strength, the second bonding layer 220 may be made of the same material used to form the first bonding layer 210. In one embodiment, the second bonding layer 220 is made of $SiO_x$.

Further, in one embodiment, the first bonding layer 210 may be formed on the first bonding surface 410 (referring to FIG. 1) before the second bonding layer 220 is formed on the second bonding surface 420 (referring to FIG. 3). In other embodiments, the second bonding layer 220 may be formed on the second biding surface 420 prior to forming the first bonding layer 210 on the first bonding surface 410.

Figure 6:
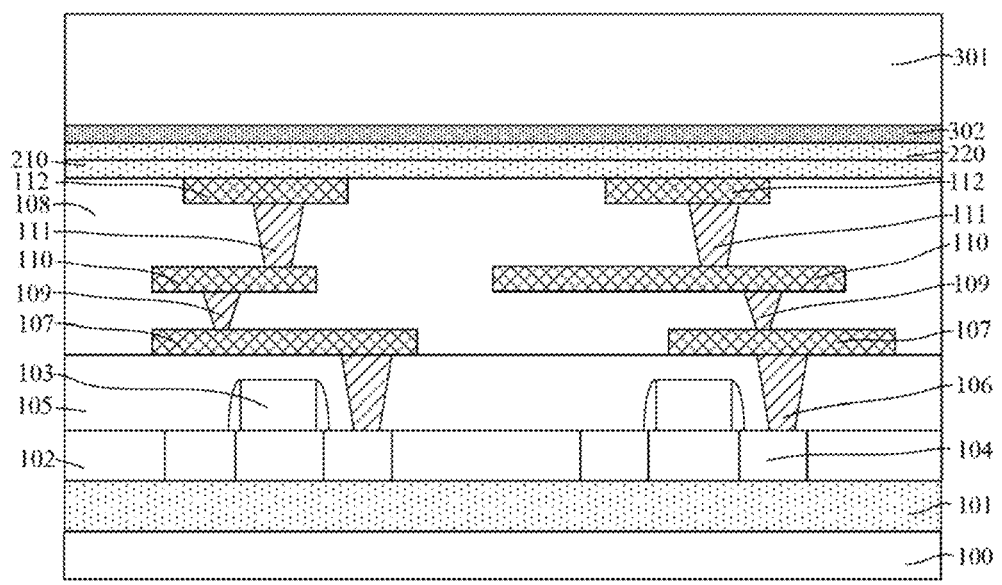

Further, returning to FIG. 9, the first bonding surface and the second bonding surface may be brought into contact with each other to realize the bonding between the wafer and the carrier wafer (S1106). FIG. 6 shows a schematic cross-section view of a corresponding semiconductor structure.

Referring to FIG. 6, the first bonding surface 410 (referring to FIG. 1) a id the second bonding surface 420 (referring to FIG. 3) may be brought into contact with each other so that the bonding between the wafer described above and the carrier wafer 301 may be realized.

In one embodiment, a first bonding layer 210 may be formed on the first bonding surface 410 and a second bonding layer 220 may be formed on the second bonding surface 420. Accordingly, in the wafer bonding process to realize the bonding between the wafer and the carrier wafer 301, the first bonding layer 210 may be in contact with the second bonding layer 220.

In one embodiment, the wafer bonding process may be a thermocompression bonding process. Specifically, the thermocompression bonding process may include the following steps. First, the wafer and the carrier wafer 301 may be arranged in opposite to each other at a thermocompression bonding temperature with the first bonding layer 210 in contact with the second bonding layer 220. Then, under the thermocompression bonding temperature, the wafer and the carrier wafer 301 may be simultaneously pressed until a process-required thermocompression bonding time is reached. As such, thermocompression bonding between the wafer and the carrier wafer 301 may be realized.

Figure 7:
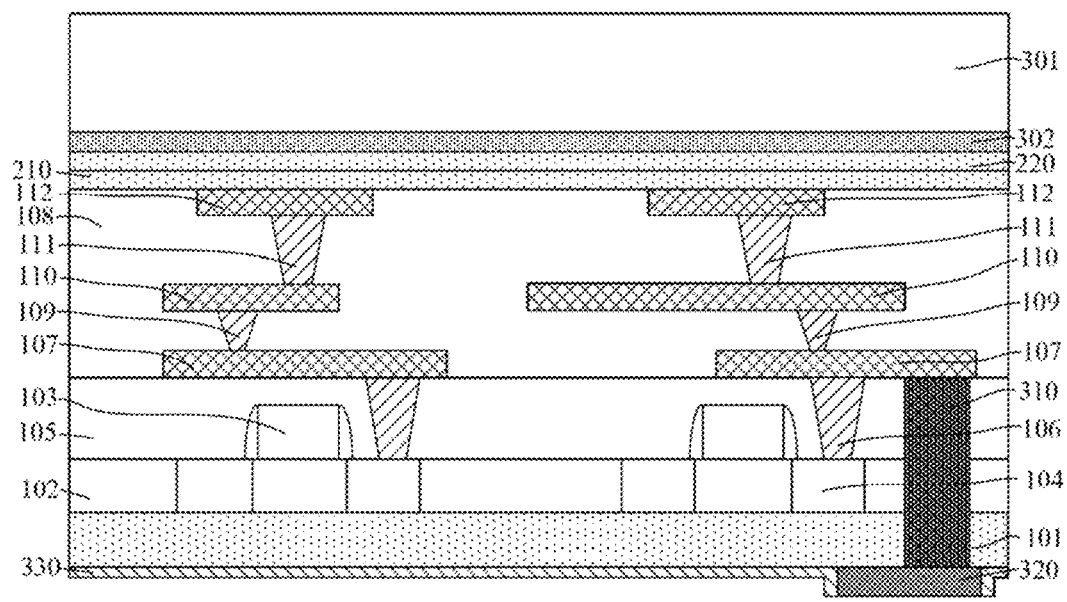

Further, returning to FIG. 9, after bonding the wafer to the carrier wafer, the bottom-level semiconductor layer may be, removed, a conductive plug may be formed through the insulating material layer, the top-level semiconductor layer, and the first dielectric layer to be in contact with a corresponding zeroth conductive layer, a connection conductive layer may be formed to cover the conductive plug, and a passivation layer may be formed on the surface of the insulating material layer opposing the first bonding surface (S1107). FIG. 7 shows a schematic cross-section view of a corresponding semiconductor structure.

Referring to FIG. 7, after realizing wafer bonding between the wafer and the carrier wafer, the fabrication process may also include removing the bottom-level semiconductor layer 100 (referring to FIG. 6). Further, a conductive plug 310 connecting with each zeroth conductive layer 107 may be formed through the insulating material layer 101, the top-level semiconductor layer 102, and the first dielectric layer 105. A connection conductive layer 320 may be formed to cover the conductive plug 310. Moreover, a passivation layer 330 may be formed on the surface of the insulating material layer 101 opposing the first bonding surface 410 (referring to FIG. 1). The passivation layer 330 may expose the surface of the connection conductive layer 320.

The RF devices formed in the wafer may generate an electric field. The electric field may easily cause induced electrical charges in the bottom-level semiconductor layer 100 (referring to FIG. 6), and the movement of the induced electrical charges may easily lead to an energy loss issue for RF signals. In addition, the bottom-level semiconductor layer 100 may be close to the gate structure 103. Therefore, in order to avoid undesired effects on the electrical performance of the transistors in the wafer, the bottom-level semiconductor layer 100 may be removed after realizing the bonding between the wafer and the carrier wafer 301.

In one embodiment, in order to avoid undesired effects on the insulating material layer 101 during the process for removing the bottom-level semiconductor layer 100, the process to remove the bottom-level semiconductor layer 100 may include the following steps. First, a first removal process may be performed to remove a portion of the bottom-level semiconductor layer 100, Then, a second removal process may be performed to remove the remaining portion of the bottom-level semiconductor layer 100. Specifically, the removal rate on the bottom-level semiconductor layer 100 during the first removal process may be larger than the removal rate on the bottom-level semiconductor layer 100 during the second removal process.

In another embodiment, the first removal process may be a polishing process, while the second removal process may be a wet etching process.

In one embodiment, after bonding the wafer and the carrier wafer 301, the wafer and the carrier wafer 301 may be electrically connected to external circuits through the conductive plug 310 and/or the connection conductive layer 320.

The conductive plug 310 may be made of one or more of Cu, AL, W, Ti, etc. The connection conducive layer 320 may be made of one or more of Cu, AL, W, Ti, etc. In One embodiment, the conductive plug 310 is made of Cu and the connection conductive layer 320 is made of Al.

Specifically, the process to form the conductive plug 310 may include the following steps. First, along a direction from the insulating material layer 101 to the first dielectric layer 105, an etching process may be performed on the insulating material layer 101, the top-level semiconductor layer 102, and the first dielectric layer 105 until the first zeroth conductive layer 107 is exposed. Therefore, a conductive via (not shown) may be formed through the insulating material layer 101, the top-level semiconductor layer 102, and the first dielectric layer 105. Further, the conductive plug 310 may be formed to fill up the conductive via.

The passivation layer 330 may be used to provide protection for the insulating material layer 101. The passivation layer 330 may be made of an insulating material, including one or more of $SiO_x$, $SiN_x$, SiON, etc. In one embodiment, the passivation layer 330 has a double-layer structure made of $SiO_x$ and $SiN_x$.

After the wafer and the carrier wafer 301 are bonded together, the RF devices in the wafer may generates an electric field. The electric field may easily cause induced electrical charges in the carrier wafer. According to the method described above, a surface treatment process may be performed on the second bonding surface 420 (referring to FIG. 3) of the carrier wafer to convert a surface portion of the carrier wafer 301 into a barrier layer 302 (referring to FIG. 4). The presence of the barrier layer 302 may suppress the movement of the induced electrical charges in the carrier wafer 301. Therefore, as the movement of the induced electrical charges in the carrier wafer 301 between the wafer and the carrier wafer 301 is avoided, the energy loss of RF signals may be avoided and the performance of the bonded chip may be improved.

Figure 8:
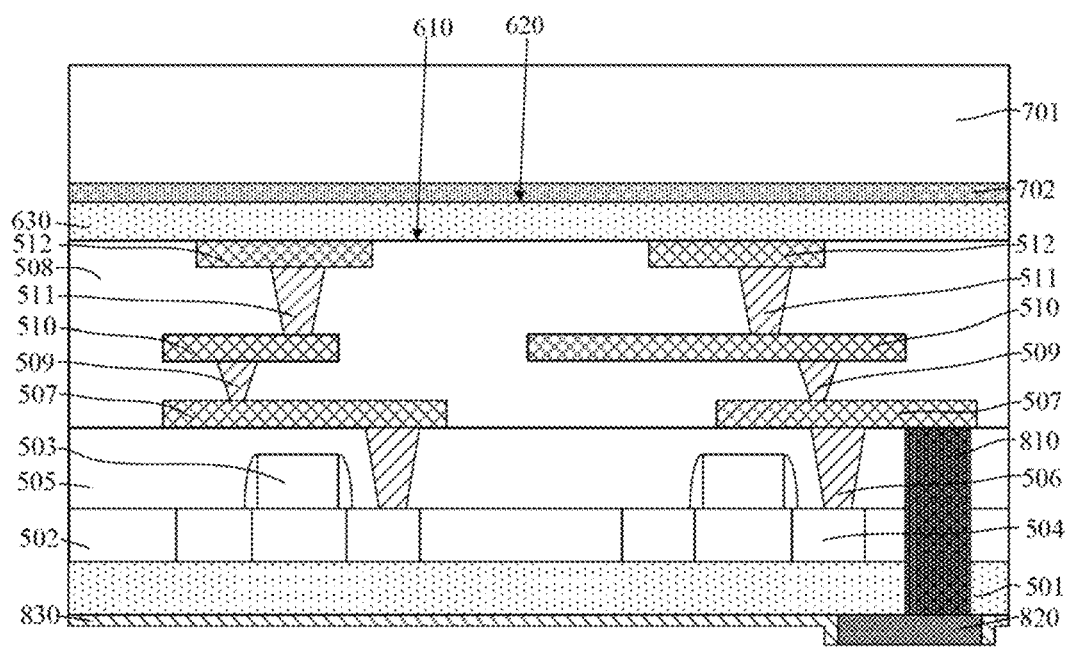
FIG. 8 illustrates a schematic cross-section view of an exemplary semiconductor structure consistent with disclosed embodiments in the present disclosure.

Further, the present disclosure also provides a semiconductor structure. FIG. 8 shows a schematic cross-section view of an exemplary semiconductor structure consistent disclosed embodiments.

Referring to FIG. 8, the semiconductor structure may include a wafer (not labeled). The wafer may have a first bonding surface 610 and a plurality of RF devices may be formed in the wafer.

Further, the semiconductor structure may include a carrier wafer 701 bonded to the wafer. The carrier wafer 701 may have a second bonding surface 620. The carrier wafer 701 may be bonded to the wafer with the first bonding surface 610 in contact with the second bonding surface 620.

Further, the semiconductor structure may also include a barrier layer 702 formed on the surface of the carrier wafer 701. In the semiconductor structure, the barrier layer 702 may be situated between the wafer and the carrier wafer 701.

In one embodiment, the wafer may include a base structure (not shown). The base structure may include an insulating material layer 501 and a top-level semiconductor layer 502 situated on the surface of the insulating material layer 501. The top-level semiconductor layer 502 may include a plurality of transistor regions (not labeled).

The wafer may also include a plurality of gate structures 501 formed on the surface of the top-level semiconductor layer 502 in the transistor regions, a plurality of doped regions 504 formed in the top-level semiconductor layer 502 on both sides of the gate structures 503 in the transistor regions, and a first dielectric layer 505 formed on the surface of the top-level semiconductor layer 502. The first dielectric layer 505 may cover the plurality of gate structures 501 and the plurality of doped regions 504. The top surface of the first dielectric layer 505 may be higher than the top surfaces of the plurality of gate structures 503.

The wafer may also include a zeroth conductive plug 506 formed on the surface of each doped region 504 through the first dielectric layer 505, a zeroth conductive layer 507 formed above the first dielectric layer 505 and electrically connected to the zeroth conductive plug 506, a second dielectric layer formed above the first dielectric layer and covering the zeroth conductive layer 507, and an interconnection structure (not labeled) formed in the second dielectric layer and electrically connected to the zeroth conductive layer 507. The interconnection structure may also include a top-level conductive layer 512. The top surface of the top-level conductive layer 512 may be exposed by the second dielectric layer 508. The surface of the second dielectric layer exposing the top-level conductive layer 512 may be the first bonding surface 610.

The insulating material layer 501 may be made of $SiO_x$, $SiN_x$, SiON, SiCN, SiCON, etc. The top-level semiconductor layer 502 may be made of silicon, germanium, SiGe, SiC, GaAs, InAs, etc. In one embodiment, the insulating material layer 501 is made of $SiO_x$ and the top-level semiconductor layer 502 is made of silicon.

In one embodiment, a plurality of transistors may be formed in the transistor regions. Each gate structure 503 may include a gate dielectric layer and a gate electrode layer formed on the gate dielectric layer. The gate dielectric layer may be made of $SiO_x$ or a high-k dielectric material. The high-k dielectric material may include hafnium oxide, zirconium oxide, aluminum oxide, HfSiO, etc. The gate electrode layer may be made of one or more of Ti, Ta, Cu, Al, W, Ag, Au, etc. In addition, a work function layer may be formed between the gate dielectric layer and the gate electrode layer.

Each doped region 504 may be used to form a source region or a drain region of a transistor. Specifically, when a transistor region is a PMOS region, the doped ions in the corresponding doped region 504 may be P-type ions, such as B, Ga, and In; when a transistor region is an NMOS region, the doped ions in the corresponding doped region 504 may be N-type ions, such as P, As, and Sb.

In one embodiment, the semiconductor structure may also include a sidewall spacer (not labeled) on each side surface of the gate structure 503. The sidewall spacer may be made of $SiO_x$, $SiN_x$, SiC, SiCN, SiCON, SiON, BN, BCN, etc. The sidewall spacer may have a single-layer structure or a multiple-layer structure, in one embodiment, the sidewall spacer has a single-layer structure and is made of $SiN_x$.

The first dielectric layer 505 may cover the top and the sidewall surfaces of the gate structures 503. The first dielectric layer 505 may have a single-layer structure or a multiple-layer structure, and may be made of $SiO_x$, $SiN_x$, SiON, etc. In one embodiment, the first dielectric layer 505 is made of $SiO_x$.

The zeroth conductive plug 506 may be used to electrically connect the corresponding zeroth conductive layer 507 to the interconnection structure (not labeled) in the second dielectric layer 508. In one embodiment, the zeroth conductive plug 106 may be made of a conductive material including one or more of Cu, Al, W, Ti, etc.

In one embodiment, the zeroth conductive layer 507 may be formed on the surface of the first dielectric layer 505 and also on the surfaces of the zeroth conductive plugs 506. Specifically, based on the requirement of internal circuit connections of the semiconductor structure, a plurality of discrete zeroth conductive layers 507 may be formed on the surface of the first dielectric layer 505.

The plurality of zeroth conductive layers 507 may be made of a conductive material including one or more of Cu, Al, W, Ti, etc. In one embodiment, the plurality of zeroth conductive layer 507 may be made of Al.

In one embodiment, along a direction perpendicular to the surface of the top-level semiconductor layer 502 and from the top-level semiconductor layer 502 to the second dielectric layer 508, the interconnection structure may include N (N≥2) layers of conductive layers, and may also include an Nth conductive pima (not shown) between the (N−1)th conductive layer and the Nth conductive layer. The Nth conductive plug may electrically connect the (N−1)th conductive layer to the Nth conductive layer. In one embodiment, the Nth conductive layer may be the top-level conductive layer 512 with the top surface exposed by the second dielectric layer 508, as shown in FIG. 8.

The second dielectric layer 508 may include at least one sub dielectric layer. When the second dielectric layer 508 is formed by two or more sub dielectric layers, the sub dielectric layers may be stacked together to form the second dielectric layer 508. The sub dielectric layer may be made of $SiO_x$, $SiN_x$, SiON, SiCN, SiCON, etc. For example, the second dielectric layer 508 may have a single-layer structure with one sub dielectric layer; the second dielectric layer may also include 2, 5, 7, or 10 sub dielectric layers.

For illustration purpose, in one embodiment, the interconnection structure is described to include two discrete sub conductive layers. Along a direction from the top-level semiconductor layer 502 to the second dielectric layer 508, the interconnection structure includes discretely arranged a first conductive layer 510 and a second conductive layer 512 as well as a second conductive plug 511 formed between the first conductive layer 510 and the second conductive layer 512. The second conductive plug 511 electrically connects the first conductive layer 510 and the second conductive liner 512. In addition, the interconnection structure also includes a first conductive plug 509 formed between the first conductive layer 510 and the zeroth conductive layer 507. The first conductive plug 509 electrically connects the zeroth conductive layer 507 to the first conductive layer 510. The second conductive layer 512 may be the top-level conductive layer 512.

In other embodiments, the interconnection structure may only include a single conductive layer. The interconnection structure may thus include the top-level conductive layer and a first conductive plug electrically connecting the top-level conductive layer to the zeroth conductive layer.

In one embodiment, N may be any natural number greater than or equal to 2. For example, the interconnection structure may include 5 conductive layers, 7 conductive layers, or 10 conductive layers. Further, the number of the conductive plugs may be determined according to the number of the conductive layers.

The interconnection structure may be made of a conductive material including one or more of Cu, Al, W, Ti, etc. In one embodiment, the interconnection structure is made of Al.

The carrier wafer 701 may be made of silicon, germanium, SiGe, SiC, GaAs, InAs, etc. In one embodiment, the carrier wafer 701 is made of silicon.

The description of the carrier wafer 701 may be referred to the corresponding content for the wafer described above.

The barrier layer 702 may be converted from a surface portion of the carrier wafer 701. Specifically, in one embodiment, the carrier wafer is made of silicon and the barrier layer 702 is made of amorphous silicon convened from single-crystalline silicon. That is, the barrier layer 702 may be made of an amorphous silicon.

The presence of the barrier layer 702 may suppress the movement of the induced electrical charges in the carrier wafer 701.

Further, the semiconductor structure may optionally include a bonding layer 630 between the wafer and the barrier layer 702. The bonding layer 630 may be used to realize the bonding between the wafer and the carrier wafer 701. The bonding layer may improve the bonding strength between the wafer and the carrier wafer 701.

The bonding layer 630 may be made of $SiO_x$ or $SiN_x$. In one embodiment, the bonding layer 630 is made of $SiO_x$.

In addition, the semiconductor structure may include a conductive plug 810 formed through the insulating material layer 501, the top-level semiconductor layer 502, and the first dielectric layer 505, and corresponding to and in contact with each zeroth conductive layer 507, a connection conductive layer 820 formed to cover the conductive plug 810, and a passivation layer 830 formed on the surface of the insulating material layer 501 opposite to the gate structure 503. The passivation layer 830 may expose the surface of the connection conductive layer 820.

In one embodiment, the wafer and the carrier wafer 701 may be electrically connected to external circuits through the conductive plug 810 and/or the connection conductive layer 820.

The conductive plug 810 may be made of one or more of Cu, Al, W, Ti, etc. The connection conductive layer 820 may also be made of one or more of Cu, Al, W, Ti, etc. In one embodiment, the conductive plug 810 is made of Cu and the connection conductive layer 820 is made of Al.

The passivation layer 830 may be used to provide protection for the insulating material layer 501. The passivation layer 830 is made of an insulating material including one or more of $SiO_x$, $SiN_x$, SiON, etc. In one embodiment, the passivation layer 830 has a double-layer structure made of $SiO_x$ and $SiN_x$.

The RF devices in the wafer may generate an electrical field. The electric field may easily cause induced electrical charges in the carrier wafer 701. According to the disclosed semiconductor structure, the presence of the barrier layer 802 may suppress the movement of the induced electrical charges in the carrier wafer 701. Therefore, as the movement of the induced electrical charges in the carrier wafer 701 between the wafer and the carrier wafer 701 is avoided, the energy loss of RF signals may be avoided and the performance of the bonded chip may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the in spirit and principle of the present invention, falls within the true scope of the present invention.

What is claimed is:

1. A method for fabricating a semiconductor structure, comprising:
    providing a wafer, including a first bonding surface and a plurality of radio-frequency (RF) devices therein;
    providing a carrier wafer, including a second bonding surface;
    forming a first bonding layer on the first bonding surface;
    performing a surface treatment process on the second bonding surface to convert a surface portion of the carrier wafer into a barrier layer to suppress movement of induced electrical charges in the carrier wafer;
    forming a second bonding layer on the second bonding surface after forming the barrier layer, the first bonding layer and the second bonding layer being made of a same material; and
    bonding the wafer with the carrier wafer by pressing simultaneously the wafer and the carrier wafer under a thermocompression temperature to bond the first bonding layer with the second bonding layer, wherein:
        the barrier layer prevents the movement of induced electrical charges between the wafer and the carrier wafer,
        the wafer and the carrier wafer are bonded together through the barrier layer, the first bonding layer, and the second bonding layer, when bonding the wafer with the carrier wafer, the first bonding layer is brought into contact with the second bonding layer,
        the first bonding layer is made of one of $SiO_x$ and $SiN_x$, and
        the second bonding layer is made of one of $SiO_x$ and $SiN_x$.

2. The method for fabricating the semiconductor structure according to claim 1, wherein the carrier wafer is made of one or more materials including Si, Ge, SiGe, SiC, GaAs, and InAs.

3. The method for fabricating the semiconductor structure according to claim 1, wherein the barrier layer is made of an amorphous material.

4. The method for fabricating the semiconductor structure according to claim 1, wherein the surface treatment process includes: performing an ion implantation process to dope ions on the second bonding surface.

5. The method for fabricating the semiconductor structure according to claim 4, wherein the ions doped during the ion implantation process are heavy ions.

6. The method for fabricating the semiconductor structure according to claim 5, wherein the ions doped during the ion implantation process include Ar ions, He ions, and Ne ions.

7. The method for fabricating the semiconductor structure according to claim 6, wherein:
the ions doped during the ion implantation process are Ar ions;
an energy of the doped ions is in a range of 30 keV and 200 keV; and
a dosage of the doped ions is in a range of 1E15 atom/cm$^2$ and 1E16 atom/cm$^2$.

8. The method for fabricating the semiconductor structure according to claim 1, wherein the wafer is prepared after performing fabrication steps including:
forming a base structure including an insulating material layer formed between a bottom-level semiconductor layer and a top-level semiconductor layer, wherein the top-level semiconductor layer includes a plurality of transistor regions;
forming a plurality of gate structures on the plurality of transistor regions;
forming a doped region in the top-level semiconductor layer on both sides of each gate structure;
forming a first dielectric layer on the top-level semiconductor layer to cover the plurality of gate structures and the plurality of doped regions, the first dielectric layer having a top surface higher than the gate structures;
forming a zeroth conductive plug through the first dielectric layer on each doped region;
forming a zeroth conductive layer above the first dielectric layer to electrically connect to each zeroth conductive plug; and
forming a second dielectric layer on the first dielectric layer to cover the zeroth conductive layer, and
forming an interconnection structure in the second dielectric layer to electrically connect to each zeroth conductive layer, the interconnection structure including a top-level conductive layer with a top surface exposed by the second dielectric layer, and the second dielectric layer having a top surface exposing the top-level conductive layer and providing the first bonding layer, wherein each zeroth conductive layer and zeroth conductive plug are isolated from the plurality of gate structures by the first dielectric layer.

9. The method for fabricating the semiconductor structure according to claim 8, wherein:
along a direction perpendicular to a top surface of the top-level semiconductor layer and from the top-level semiconductor layer to the second dielectric layer, the interconnection structure includes a number of N (N≥2) discrete conductive layers and an Nth conductive plug situated between a (N−1)th conductive layer and a Nth conductive layer,
wherein the Nth conductive plug electrically connects the (N−1)th conductive layer to the Nth conductive layer; and
the second dielectric layer includes at least one sub dielectric layer.

10. The method for fabricating the semiconductor structure according to claim 8, wherein:
the zeroth conductive layer is made of one or more of Cu, Al, W, and Ti; and
the interconnection structure is made of one or more of Cu, Al, W, and Ti.

11. The method for fabricating the semiconductor structure according to claim 8, further including:
removing the bottom-level semiconductor layer after bonding the wafer and the carrier wafer together;
forming a conductive plug to electrically connect each zeroth conductive layer through the insulating material layer, the top-level semiconductor layer, and the first dielectric layer;
forming a connection conductive layer to cover the conductive plug; and
forming a passivation layer on a surface of the insulating material layer opposing the first bonding surface to expose a surface of the connection conductive layer, wherein the connection conductive layer is electrically connected to the doped region through the conductive plug, the zeroth conductive layer, and the zeroth conductive plug.

12. The method for fabricating the semiconductor structure according to claim 11, wherein the conductive plug is made of one or more of Cu, Al, W, and Ti.

13. The method for fabricating the semiconductor structure according to claim 11, wherein the connection conductive layer is made of one or more of Cu, Al, W, and Ti.

14. The method for fabricating the semiconductor structure according to claim 11, wherein the passivation layer is made of one or more of $SiO_x$, $SiN_x$, and SiON.

15. A semiconductor structure, comprising:
a wafer, including a first bonding surface and a plurality of radio-frequency (RF) devices therein;
a carrier wafer, including a second bonding surface;
a barrier layer in the carrier wafer and at an interface between the wafer and the carrier wafer;
a first bonding layer on the first bonding surface; and
a second bonding layer on the second bonding surface after forming the barrier layer, wherein:
the wafer and the carrier wafer are bonded together by pressing simultaneously the wafer and the carrier wafer under a thermocompression temperature to bond the first bonding layer with the second bonding layer,
the barrier layer prevents the movement of induced electrical charges between the wafer and the carrier wafer, the first bonding layer and the second bonding layer are made of a same material, and
the wafer and the carrier wafer are bonded together through the barrier layer, the first bonding layer, and the second bonding layer,
when bonding the wafer with the carrier wafer, the first bonding layer is brought into contact with the second bonding layer,
the first bonding layer is made of one of $SiO_x$ and $SiN_x$, and
the second bonding layer is made of one of $SiO_x$ and $SiN_x$.

16. The semiconductor structure according to claim 15, wherein the barrier layer is formed by converting a surface portion of the carrier wafer.

17. The semiconductor structure according to claim 15, wherein the barrier layer is made of an amorphous material.

18. The semiconductor structure according to claim 15, further including one or more bonding layers between the wafer and the barrier layer.

* * * * *